United States Patent
Lee et al.

[11] Patent Number: 5,953,579
[45] Date of Patent: Sep. 14, 1999

[54] IN-LINE TEST OF CONTACT OPENING OF SEMICONDUCTOR DEVICE

[75] Inventors: Sang-kil Lee, Suwon; Byung-am Lee, Seoul; Kyoung-mo Yang, Suwon, all of Rep. of Korea

[73] Assignee: Samsung Electronics Co., Ltd., Suwon, Rep. of Korea

[21] Appl. No.: 08/902,107

[22] Filed: Jul. 29, 1997

[30] Foreign Application Priority Data

Jul. 30, 1996 [KR] Rep. of Korea ...................... 96-31389

[51] Int. Cl.$^6$ ............................ G01R 31/26; H01L 21/66; G01N 23/00; G21K 7/00
[52] U.S. Cl. ............................... 438/16; 250/307; 250/311
[58] Field of Search ................................ 438/10, 12, 17, 438/16; 250/307, 311

[56] References Cited

U.S. PATENT DOCUMENTS 5,214,283  5/1993  Le ........................................... 250/307
5,594,245  1/1997  Todokoro et al. ...................... 250/310

*Primary Examiner*—Brian Dutton
*Attorney, Agent, or Firm*—Jones & Volentine, L.L.P.

[57] ABSTRACT

A method for testing a contact opening of a semiconductor device includes the steps of: inspecting a wafer using an in-line scanning electron microscope, comparing a contrast difference of contact opening regions displayed on the scanning electron microscope, and determining whether the processes for forming the contact openings have been performed correctly based on results of the comparison step. The test method may be performed after any of a contact photolithography process, contact etching process, or conductive layer etching process.

8 Claims, 5 Drawing Sheets

IN-LINE TEST OF CONTACT OPENING OF SEMICONDUCTOR DEVICE

BACKGROUND OF THE INVENTION

1. Field of the Invention

The present invention relates to a test for contact openings of a semiconductor device. More particularly, it relates to a test for contact openings that may prevent contact failure by inspecting a wafer prepared in the semiconductor production line with an in-line scanning electron microscope (SEM) at certain points during the process for forming the contact opening. The process conditions for forming the contact openings is controlled using data obtained from the inspection.

2. Description of the Related Art

Generally, a contact hole or contact opening for a semiconductor device is formed by etching a predetermined region of an insulating layer to allow for electrical contact between internal elements or conductive layers of the device. Either a conductive metal for wiring, or a polysilicon material for forming a charge-storage plate of a condenser, is normally deposited in the contact hole.

FIG. 1 shows a sequence of forming a contact opening according to a conventional process. First, in step S2, a contact photolithography process is carried out to form a pattern for the contact hole on a predetermined layer formed on a wafer. More specifically, during step S2, a photoresist is coated on the predetermined layer on the wafer. Then, a contact opening region, where a contact hole is to be formed, is exposed to light and developed so that the photoresist in the contact opening region is removed to thereby form an etching mask for the formation of a contact hole. An insulating layer is commonly used as the abovementioned predetermined layer.

A contact etching process for the contact opening is performed in step S4. A contact hole of predetermined profile is thus formed in the predetermined layer. Subsequently, in step S6, a conductive metal is deposited onto the predetermined layer having the contact hole. The metal layer formed through the deposition process of S6 is etched to a predetermined pattern for wiring or condenser formation through a conductive layer photolithography process (step S8) and a conductive layer etching process (step S10).

A metallization process and a passivation process (not shown) are successively carried out to complete the steps in the manufacture of the semiconductor device.

In step S12, the completed integrated circuit (IC) wafer undergoes an electrical die sorting (EDS) test which inspects the electrical characteristics of each chip. The chips are considered substandard when the contact holes are not precisely formed. Contact failures are a principal cause of semiconductor device malfunctions. Such contact failures can not be fixed at this late stage and the chip must be discarded, resulting in waste, inefficiency, and higher semiconductor production costs.

The contact failures occur for a variety of reasons. For example, a failure may occur when the photoresist is not completely removed within in the contact hole pattern through the contact photolithography process of step S2. Also, a failure may occur when the insulating layer remains within the contact hole as a result of an incomplete contact opening etching process of step S4.

The equipment or process conditions for performing the contact photolithography process in step S2 or the contact opening etching process in step S4 is checked and modified upon detection of an abnormality by the EDS test in step S12. In that way, enhanced process control and increased IC yields may be achieved.

However, using conventional techniques, it generally takes about two to three months from the time the EDS test identifies a failure until a remedy for the contact opening failure is effected. During this long period, the manufacturing yield is reduced and process efficiency is greatly reduced.

SUMMARY OF THE INVENTION

Accordingly, the present invention is directed to a test for contact openings of a semiconductor device that substantially overcomes one or more of the problems due to limitations and disadvantages of the related art.

The present invention provides a method of testing contact openings of a semiconductor device by inspecting a wafer by means of an in-line scanning electron microscope (SEM).

The present invention also provides a method of testing contact openings of a semiconductor device, which is performed during certain points of the contact opening formation process, in order to reduce the time required for the contact opening inspection and for the control of the process conditions in response to the resulting data obtained from the inspection.

To achieve these and other advantages and in accordance with the purpose of the present invention, as embodied and broadly described, provides for a method of in-line testing of contact openings of a semiconductor device comprising the steps of: inspecting, with an in-line scanning electron microscope, a surface of a wafer on which a plurality of processes for forming contact openings have been performed; comparing a contrast difference between contact opening regions displayed on the scanning electron microscope; and determining whether respective ones of the plurality of processes for forming contact openings have been performed correctly based on results of the comparison step.

The above steps may be carried out after any of several processes for forming the wafer are completed, including: exposing and developing a photoresist coated onto the wafer, etching an insulating layer formed over the wafer, or etching a conductive layer formed over the wafer.

The inventive method further includes the step of adjusting and controlling the process conditions of a corresponding apparatus for performing the process according to the resulting data which is automatically fed back from the inspection and comparing steps.

The steps for inspecting the contact openings may be performed with respect to either all the wafers in a batch, or selected ones of the wafers in the batch.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE ATTACHED DRAWINGS

The accompanying drawings illustrate an embodiment of the invention and together with the description serve to explain the principles of the invention, in which.

Figure 2:
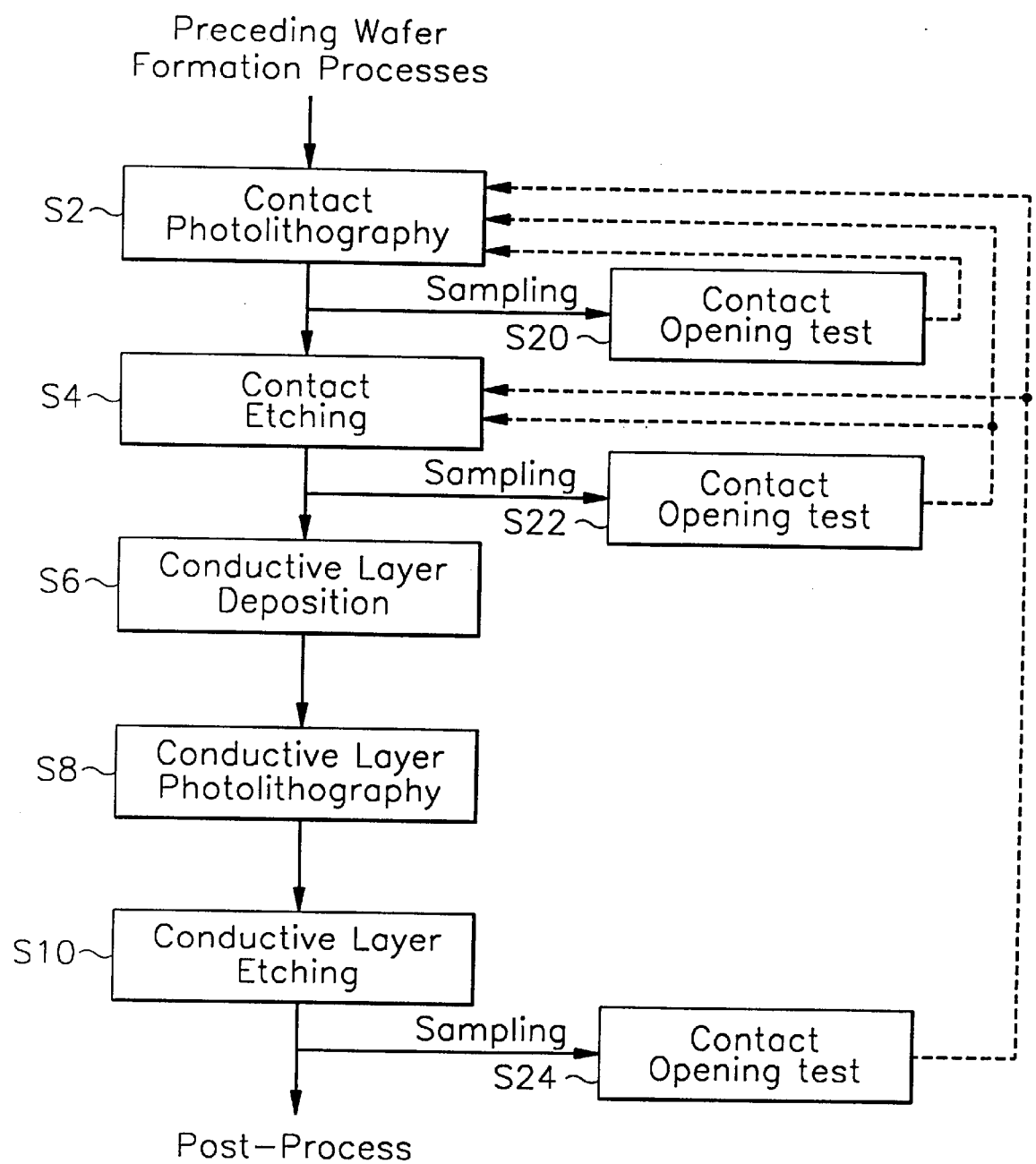
FIG. 2 is a flow diagram of a manufacturing process and test sequence of contact openings of a semiconductor device in accordance with the present invention.
Figure 4A:
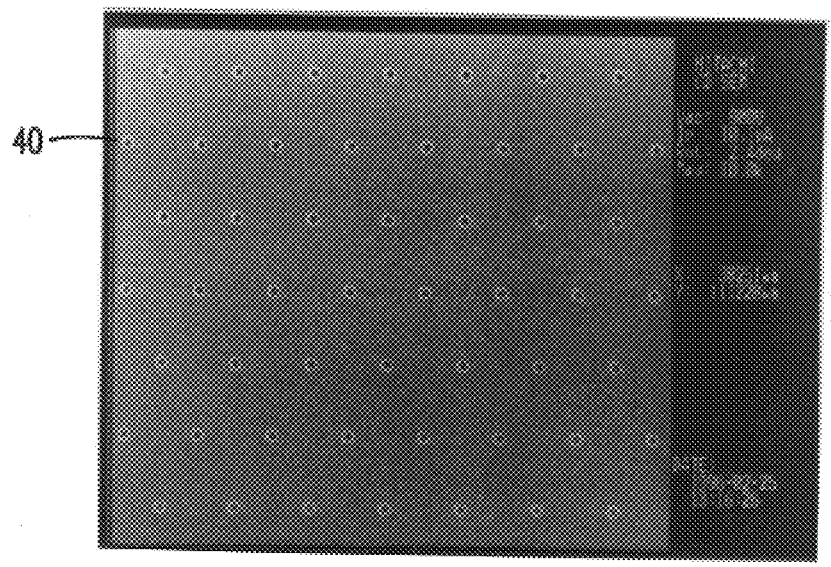
FIG. 4A is a scanning electron microscope (SEM) photograph showing a normal wafer in which contact holes are opened through a contact etching process according to FIG. 2.
Figure 4B:
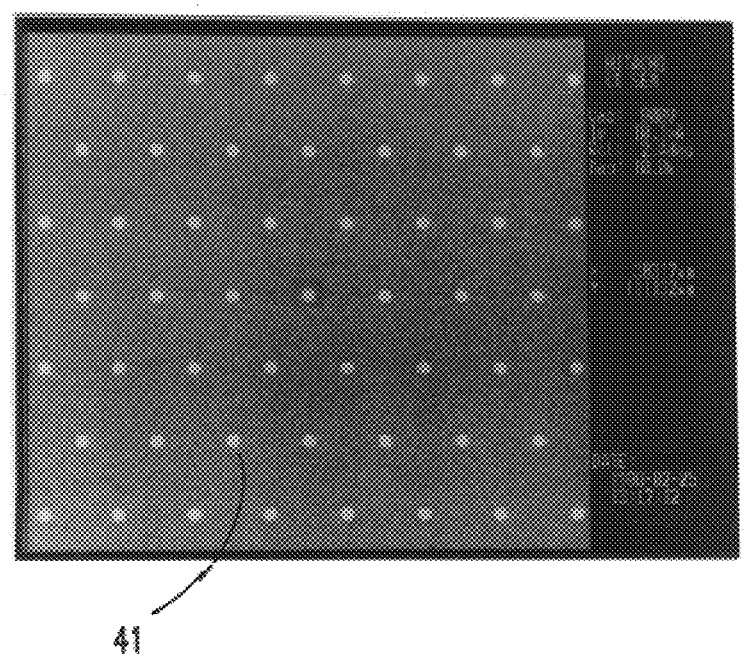
Figure 5:
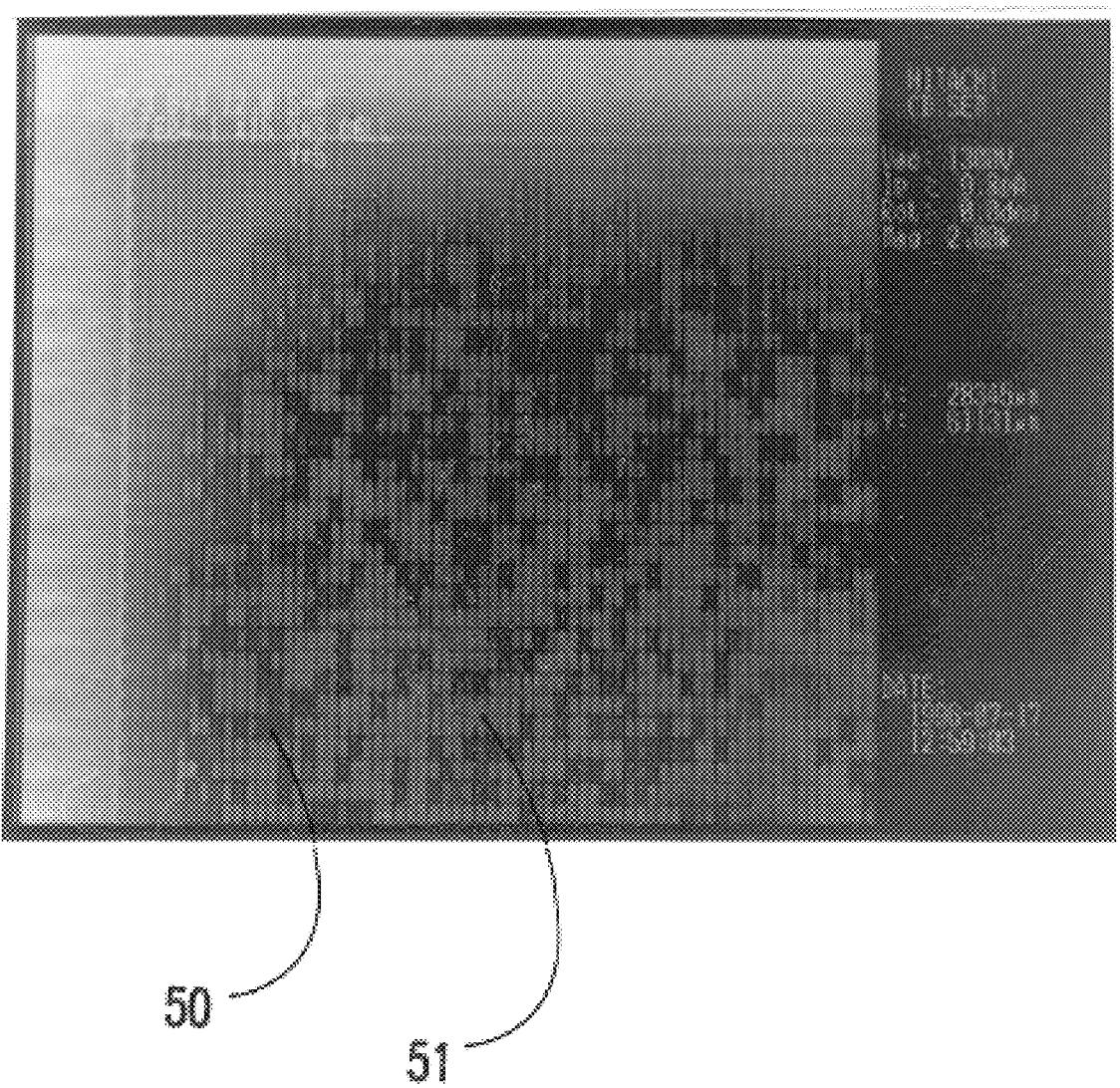

FIG. 4B is a scanning electron microscope (SEM) photograph showing a abnormal wafer in which contact holes are not opened through the contact etching process of FIG. 2; and FIG. 5 is a scanning electron microscope (SEM) photograph showing a wafer displayed for a contact opening test after the conductive layer deposition, conductive layer photolithography, and conductive layer etching processes for the contact holes according to FIG. 2.

DETAILED DESCRIPTION OF PREFERRED EMBODIMENT

It is to be understood that both the foregoing general description and the following detailed description are exemplary and explanatory and are intended to provide further explanation of the invention as claimed. Reference will now be made in detail to a preferred embodiment of the present invention, examples of which are illustrated in the accompanying drawings.

Referring to FIG. 2, the present invention is directed to a contact opening test employing an in-line scanning electron microscope (SEM) which is utilized for inspecting the contact holes after various intermediate processes for forming the contact holes is completed.

The SEM utilizes the principle that when beam electrons sweep over a material to be scanned, electrons within the material are emitted to outside or the electrons incident on the material may be ejected therefrom according to the kind and state of the material. The intensity of the secondary electrons generated at the point of impact of the beam on the material is measured, and the resulting signal is fed into a cathode-ray-tube display which is scanned in synchronism with the scanning of the material. The intensity of electrons generated from each material can be confirmed by the contrast difference observed on the SEM.

Figure 3:
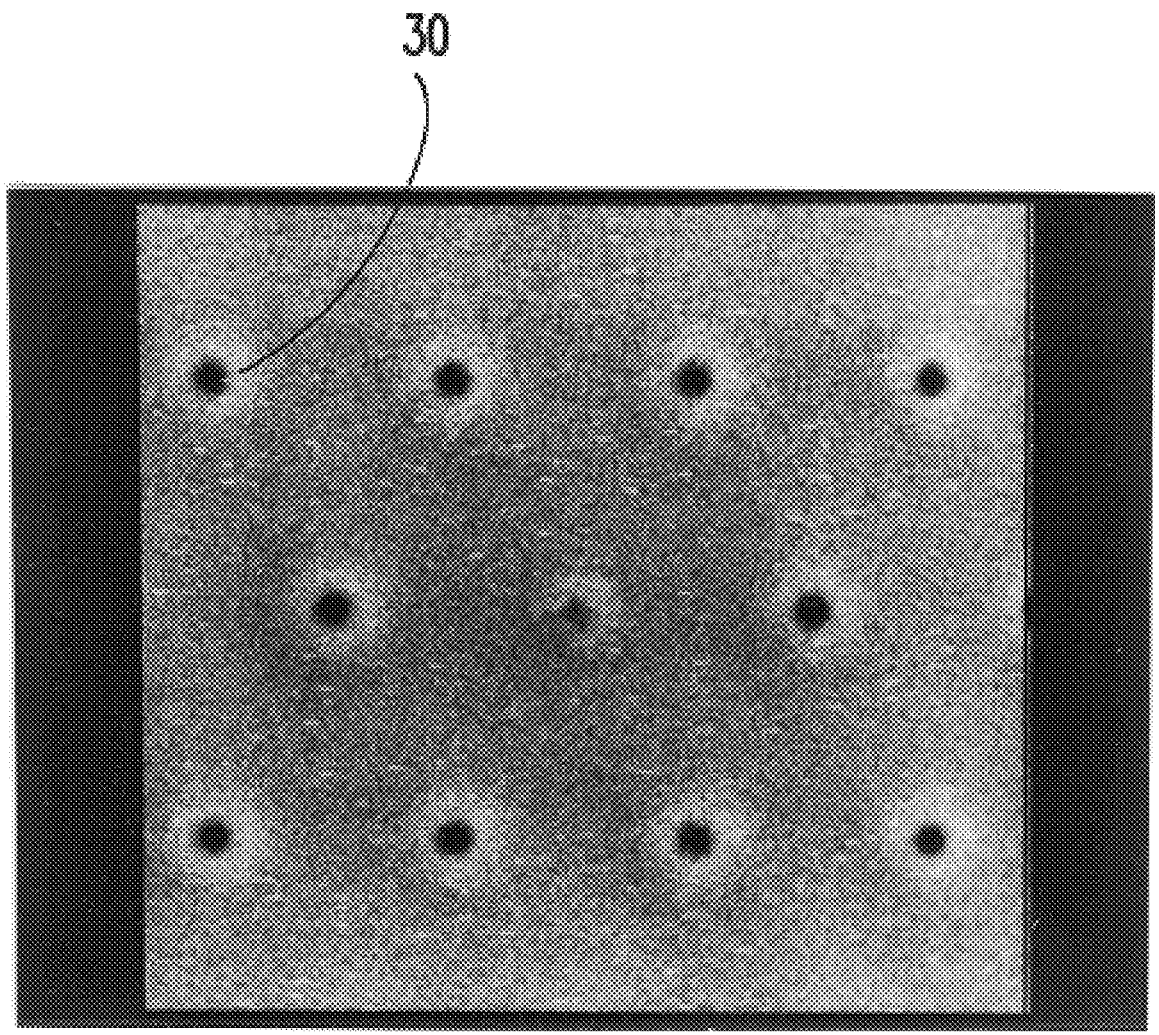
FIG. 3 is a scanning electron microscope (SEM) photograph showing a wafer displayed for a contact opening test after a contact photolithography process according to FIG. 2.

The contrast between areas where a contact opening are not precisely formed and those areas where the contact openings are precisely formed is quite evident when viewed by a SEM. FIGS. 3 to 5, discussed further later, respectively show the contrast differences in the SEM photographs.

Figure 1:
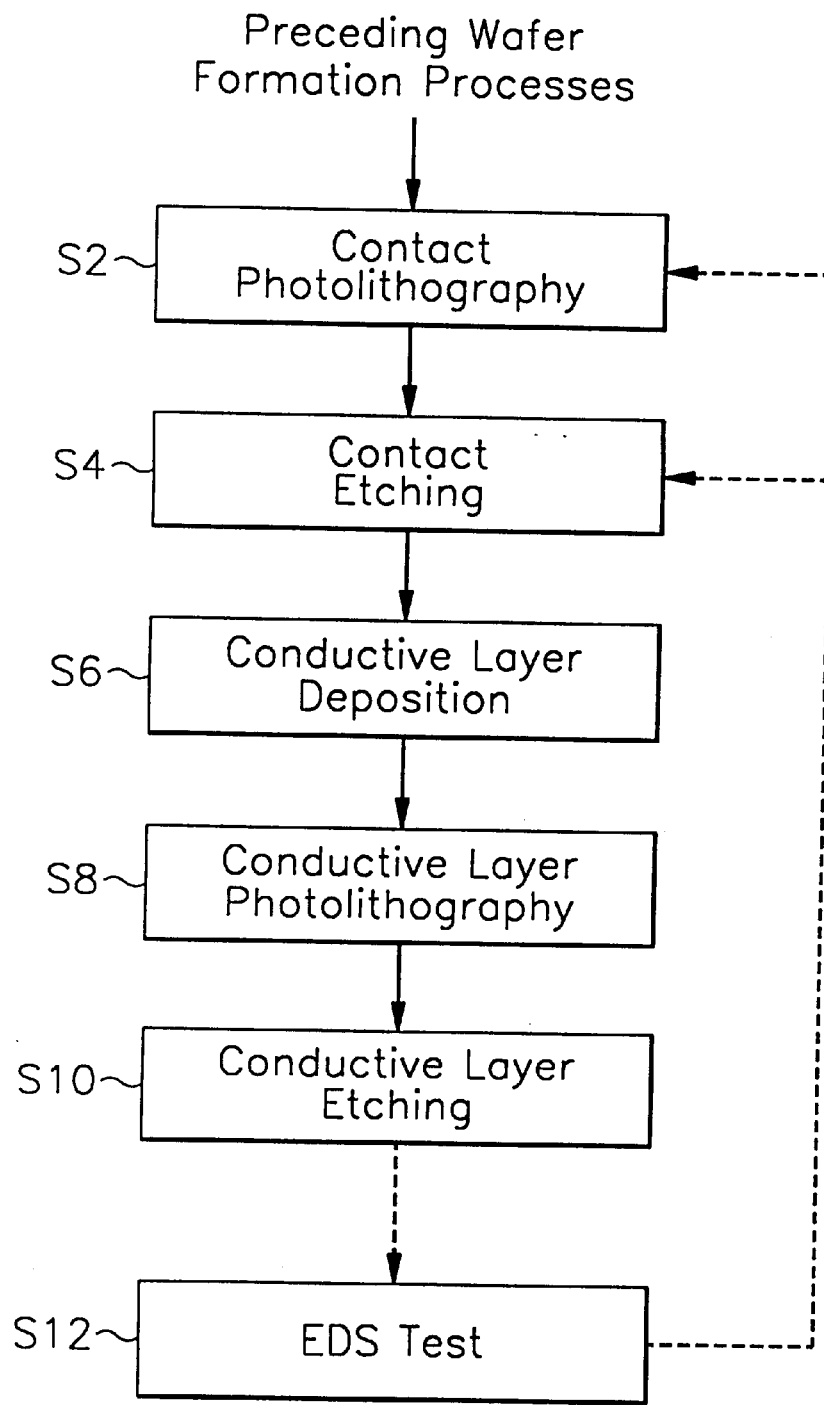
FIG. 1 is a flow diagram of a conventional manufacturing process and test sequence of contact openings of a semiconductor device.

As shown in FIG. 2, a plurality of the process steps including a contact photolithography process (step S2), a contact etching process (step S4), a conductive layer deposition process (step S6), conductive layer photolithography process (step S8), and a conductive layer etching process (step S10) are carried out in serial order to form a contact opening. The steps of FIG. 2 are the same as those described previously with regard to FIG. 1, and accordingly, a detailed description thereof is omitted here.

The in-line SEM inspection, comparison and analysis method of the present invention may be employed after any or all of steps S2, S4 and S10 in FIG. 2. Moreover, the method of the present invention may be performed on all the wafers or a part of the wafers in each batch.

FIG. 3 shows a SEM photograph of the wafer that has passed through the contact opening test (step S20 of FIG. 2) after the performance of the contact lithography process of step S2. Using an in-line SEM, the contact opening test (step S20) of the present invention comprises the step of first inspecting the surface of the processed wafer. The contrast difference of the contact opening region displayed on the scanning electron microscope is then compared and analyzed. By observing the contrast difference, it can be determined whether a process or processes for forming contact openings have been performed correctly based on the results of the comparison step.

For the plurality of contact openings 30 shown in FIG. 3, contact opening failures can be determined by observing and analyzing the central contact hole region. If photoresist remains in the central contact hole region due to poor developing, the central contact hole region is lighter in contrast to its other parts. On the other hand, when the photoresist is completely removed from the respective contact hole region, the contrast is much darker. Accordingly, the region where a contact hole is not precisely formed (lighter region) shows a different contrast from that of the region with a contact hole that is precisely formed (darker region).

If the occurrence of contact failure is determined through the contact opening test of step S20, the conditions for performing the photolithography process of step S2 are adjusted, and/or the corresponding piece of equipment that performs the process of step S2 is checked, to thereby prevent the further production of abnormal wafers. Also, at this stage, the photolithography process of step S2 may be repeated on the abnormal wafer so that it can be reused.

FIGS. 4A and 4B show SEM photographs of the wafers that have passed through a contact opening test S22 after the performance of the contact opening etching process of step S4. The contact opening test of step S22 is similar to the contact opening test of step S20 of the present invention, and thus the discussion will not be repeated here.

Specifically, FIG. 4A is a SEM photograph showing a normal wafer in which the etching process of step S4 for the contact openings 40 is precisely carried out. FIG. 4B is a SEM photograph showing a wafer with abnormal contact openings 41, either because the etching process for the contact opening of step S4 was not correctly performed or because photoresist still remains in the contact hole region from the photolithography process of step S2, even if the etching process of step S4 was performed correctly.

Accordingly, the conditions for performing the photolithography process of step S2 or the contact opening etching process of step S4 are adjusted, and/or the corresponding piece of equipment that performs the photolithography process of step S2 or the etch process of step S4 is checked, to thereby prevent the further production of abnormal wafers at this early stage.

Each wafer on which the contact opening etching process S4 is completed undergoes the conductive layer deposition process of step S6 where a metallic conductive layer is filled in the contact opening to thereby allow electrical connection between internal elements. A conductive layer photolithography process in step S8 forms a predetermined pattern on the metallic conductive layer, followed by the conductive layer etching process of step S10.

After the conductive layer etching process of step S10, another contact opening test S24 is performed. Again, the contact opening test of step S24 is similar to the contact opening test of step S20 of the present invention, and thus the discussion will not be repeated here.

FIG. 5 is a SEM photograph showing a wafer after completing of the conductive layer etching process of step S10. FIG. 5 clearly shows the significant contrast difference between the regions where the contact holes are exactly opened 50 (darker contrast regions) and those in which the contact holes are imperfectly opened 51 (lighter contrast regions).

More specifically, if an insulating material remains in the contact hole while the conductive layer is being deposited, or a void is formed in the contact hole, the electric path therebetween is interrupted, resulting in a charge build-up on the conductive layer. The films forming the contact hole region thus have different electrical states, which causes a significant contrast difference between the regions where the contact holes are perfectly opened (darker regions) and those in which the contact holes are not opened (lighter regions) as shown in FIG. 5.

Accordingly to the results of the contact opening test of step S24, the conditions for performing the photolithography process of step S8 or the etching process of step S10 are adjusted, and/or the corresponding piece of equipment that performs the photolithography process of step S8 or the etch process of step S10 is checked, to thereby prevent the further production of abnormal wafers at an early stage.

If no contact failures are detected in any of the contact opening test sequences of steps S20, S22 and S24, the process conditions are maintained and the wafer is conveyed to subsequent stations for post-processing steps.

According to the above-discussed preferred embodiment of the present invention, since the contact opening test using the in-line SEM is performed after the photolithography process of step S2, the contact opening etching process of step S4, and the conductive layer etching process of step S10 have been carried out on a wafer, as soon as a contact failure is detected by the inspection, comparison and determining steps above, the control of the corresponding process conditions is quickly adjusted by the data obtained from the inspection, comparison and determining steps to prevent the further production of abnormal wafers wit the same contact failure.

With this data feedback, which can be automated with means generally known to those of ordinary skill in the art, proper measures may be taken quickly to rectify the contact failure.

The time required for this corrective action may be reduced to about one or two days, which is significantly less than the two to three months to take proper action against a contact failure from the time a conventional EDS test is performed. Thus, the present invention can prevent the production of abnormal wafers at an early stage, thereby enhancing productivity and lowering overall production costs.

It will be apparent to those skilled in the art that various modifications and variations can be made in the contact opening test for a semiconductor device of the present invention without departing from the spirit or scope of the invention. Thus, it is intended that the present invention cover the modifications and variations of this invention that come within the scope of the appended claims and their equivalents.

What is claimed is:

1. A method of in-line testing of contact openings of a semiconductor device comprising the steps of:

inspecting, with an in-line scanning electron microscope, a surface of a wafer on which a plurality of processes for forming contact openings have been performed;

comparing a contrast difference between contact opening regions displayed on the scanning electron microscope; and determining whether respective ones of said plurality of processes for forming contact openings have been performed correctly based on results of said comparison step.

2. The method according to claim 1, wherein said respective ones of said plurality of processes for forming contact openings includes exposing and developing a photoresist coated onto the wafer, and wherein said inspecting, comparing, and determining steps are carried out immediately after the performance of said exposing and developing process.

3. The method according to claim 1, wherein said respective ones of said plurality of processes for forming contact openings includes etching an insulating layer formed over the wafer, and wherein said inspecting, comparing, and determining steps are carried out immediately after the performance of said etching process.

4. The method according to claim 1, wherein said respective ones of said plurality of processes for forming contact openings includes etching a conductive layer formed over the wafer, and wherein said inspecting, comparing, and determining steps are carried out immediately after the performance of said conductive layer etching process.

5. The method according to any one of claims 2, 3 or 4, further comprising the step of adjusting respective ones of said plurality of process conditions of a corresponding apparatus for performing said respective ones of said plurality of processes, according to resulting data obtained from the inspecting, comparing, and determining steps.

6. The method according to claim 5, wherein said adjusting step is performed automatically using the resulting data as feedback.

7. The method according to any one of claims 2, 3 or 4, wherein said inspecting, comparing, and determining steps are sequentially performed on all wafers in a common batch of wafers.

8. The method according to any one of claim 2, 3 or 4, wherein said inspecting, comparing, and determining steps are sequentially performed on selected wafers in a common batch of wafers.

* * * * *